(12) United States Patent
Kakinoki

(10) Patent No.: US 7,626,127 B2
(45) Date of Patent: Dec. 1, 2009

(54) SHIELD STRUCTURE

(75) Inventor: Wataru Kakinoki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/273,094

(22) Filed: Nov. 18, 2008

(65) Prior Publication Data

US 2009/0057002 A1    Mar. 5, 2009

Related U.S. Application Data

(63) Continuation of application No. PCT/JP2007/058749, filed on Apr. 23, 2007.

(30) Foreign Application Priority Data

May 30, 2006 (JP) .............................. 2006-150114

(51) Int. Cl.
*H05K 9/00* (2006.01)
(52) U.S. Cl. ..................... 174/382; 174/377; 361/816
(58) Field of Classification Search ................ 174/377, 174/382; 361/816, 818, 752
See application file for complete search history.

(56) References Cited

U.S. PATENT DOCUMENTS 5,999,416 A * 12/1999 McAnally et al. ............ 361/816
7,501,587 B2 * 3/2009 English ........................ 174/354

FOREIGN PATENT DOCUMENTS

| JP | 3-66160 | 6/1991 |
| JP | 7-249886 | 9/1995 |
| JP | 11-4093 | 1/1999 |
| JP | 2000-196280 | 7/2000 |
| JP | 2002-353033 | 12/2002 |
| JP | 2003-110274 | 4/2003 |

OTHER PUBLICATIONS

PCT/JP2007/058749 International Search Report dated May 14, 2007.
PCT/JP2007/058749 Written Opinion dated May 14, 2007.

* cited by examiner

*Primary Examiner*—Hung V Ngo
(74) *Attorney, Agent, or Firm*—Dickstein Shapiro LLP

(57) ABSTRACT

A shield structure having a plurality of hollow columnar base members arranged with intervals therebetween along the periphery of a section to be shielded on a surface of a circuit board, and a shield cover with a peripheral wall having insertion pieces arranged along the edge thereof at positions corresponding to the positions where the base members are arranged. Each base member has a cut in at least a top surface thereof. The cut forms an elastically deformable tongue portion having a free end at a position where the corresponding insertion piece of the shield cover is inserted. The tongue portion is elastically deformed toward the inner space of the base member by an insertion force applied when the corresponding insertion piece of the shield cover is inserted into the cut at the free end. The tongue portion functions as an elastic holding portion that retains and fixes the shield cover on the base member by applying an elastic resilient force such that the free end thereof presses against the insertion piece of the shield cover.

17 Claims, 10 Drawing Sheets

SHIELD STRUCTURE

CROSS REFERENCE TO RELATED APPLICATIONS

The present application is a continuation of International Application No. PCT/JP2007/058749, filed Apr. 23, 2007, which claims priority to Japanese Patent Application No. JP2006-150114, filed May 30, 2006, the entire contents of each of these applications being incorporated herein by reference in their entirety.

FIELD OF THE INVENTION

The present invention relates to a shield structure having a shield casing that covers and shields a section to be shielded on a circuit board surface of a circuit board.

BACKGROUND OF THE INVENTION

FIG. 13a is a schematic perspective view of an example of a shield structure (see, for example, Patent Document 1). FIG. 13b is a schematic exploded view of the shield structure shown in FIG. 13a. The shield structure 40 includes a shield cover 42 that covers a section to be shielded Z on a circuit board surface of a circuit board 41 so as to shield an electric circuit formed in the section to be shielded Z on the circuit board 41. The shield structure 40 has a plurality of shield-cover attachment bases 43 arranged along the periphery of the section to be shielded Z with intervals therebetween on the board surface of the circuit board 41. The shield cover 42 includes a cover plate 44 that covers the section to be shielded Z on the circuit board 41 and a peripheral wall 45 that extends from the periphery of the cover plate 44 toward the periphery of the section to be shielded Z. The peripheral wall 45 of the shield cover 42 has attachment tabs 46 disposed along the edge thereof at positions corresponding to the positions where the shield-cover attachment bases 43 are arranged.

As shown in FIG. 13c, each shield-cover attachment base 43 is constituted of a rectangular parallelepiped box, and has an opening 47 in the top surface thereof. The opening 47 has edge portions that face each other, and a pair of spring terminals 48A and 48B extend from the edge portions toward the inside of the shield-cover attachment base 43. The pair of spring terminals 48A and 48B are arranged to be pressed against each other. The shield-cover attachment bases 43, each of which has the above-described structure, are arranged on the circuit board 41 such that the bottom surfaces of the shield-cover attachment bases 43 are in contact with the board surface of the circuit board 41. When the shield-cover attachment bases 43 are arranged on the circuit board 41 in the above-described manner, the spring terminals 48A and 48B are connected to the ground of the circuit board 41 via ground connection means (not shown).

The shield cover 42 is attached to the circuit board 41 such that each attachment tab 46 is inserted between the spring terminals 48A and 48B of the corresponding shield-cover attachment base 43 and is elastically held between the spring terminals 48A and 48B, as shown in FIG. 13d. The shield cover 42 is connected to the ground of the circuit board 41 so as to shield the section to be shielded Z on the circuit board 41. In FIG. 13b, the reference numeral 50 denotes components included in the electric circuit.

Patent Document 1: Japanese Unexamined Patent Application Publication No. 11-4093

In the process of arranging components including the shield-cover attachment bases 43 on the board surface of the circuit board 41, the components may be conveyed to the circuit board 41 in the following manner. That is, a conveying suction nozzle retains the top surface of a component by suction and conveys the component to a predetermined arrangement position on the circuit board 41. The suction conveying method is often used because the conveying device has a simple structure and the rate of failure in the process of conveying the component is low.

However, the conveying suction nozzle cannot retain the top surface of the shield-cover attachment bases 43 top surfaces thereof by suction because each of the shield-cover attachment bases 43 in the shield structure 40 has the opening 47 in the top surface thereof. Therefore, the shield-cover attachment bases 43 cannot be conveyed by the suction conveying method, and another conveying method must be used. As a result, an expensive conveying device having a complex structure, for example, is required. This causes a problem that the manufacturing costs will be increased.

In addition, the shield-cover attachment bases 43 must be placed on the circuit board 41 such that the surfaces in which the spring terminals 48A and 48B are formed face upward. In other words, the shield-cover attachment bases 43 must be carried and arranged while the orientation of the shield-cover attachment bases 43 in the vertical direction is controlled. Therefore, a cumbersome process is required in which, for example, the orientations of the shield-cover attachment bases 43 to be conveyed are adjusted in the vertical direction before the shield-cover attachment bases 43 are conveyed to the circuit board 41. This preparation process may require additional tools or materials, and the number of manufacturing steps is increased. As a result, high costs are incurred.

SUMMARY OF THE INVENTION

The present invention has the following structure for solving the above-described problems. That is, the present invention provides a shield structure having a shield cover that covers a section to be shielded on a board surface of a circuit board to shield the section to be shielded on the circuit board, wherein a plurality of hollow columnar base members are arranged with intervals therebetween along the periphery of the section to be shielded on the board surface of the circuit board, each base member being in a horizontal orientation such that a peripheral surface of the base member extends along the board surface, wherein the shield cover has a peripheral wall that extends from the periphery of a cover plate that covers the section to be shielded on the circuit board toward the periphery of the section to be shielded on the circuit board surface, the peripheral wall having insertion pieces arranged along an edge of the peripheral wall at positions corresponding to the positions where the base members are arranged, and wherein each base member has a cut formed at least in a section of the peripheral surface that serves as a top surface, the cut forming an elastically deformable tongue portion having a free end at a position where the corresponding insertion piece of the shield cover is inserted, the tongue portion being elastically deformed toward the inner space of the base member by an insertion force applied when the corresponding insertion piece of the shield cover is inserted into the cut at the free end of the tongue portion and functioning as an elastic holding portion that retains and fixes the shield cover on the base member by applying an elastic resilient force such that the free end presses the insertion piece of the shield cover.

The present invention also provides a shield structure having a shield cover that covers a section to be shielded on a board surface of a circuit board to shield the section to be shielded on the circuit board, wherein a plurality of hollow columnar base members are arranged with intervals therebetween along the periphery of the section to be shielded on the board surface of the circuit board, each base member being in a horizontal orientation such that a peripheral surface of the base member extends along the board surface, wherein the shield cover has a peripheral wall that extends from the periphery of a cover plate that covers the section to be shielded on the circuit board toward the periphery of the section to be shielded on the circuit board surface, the peripheral wall having insertion pieces arranged along an edge of the peripheral wall at positions corresponding to the positions where the base members are arranged, and wherein each base member has a cut formed at least in a section of the peripheral surface that serves as a top surface, the cut forming a pair of elastically deformable tongue portions having free ends at a position where the corresponding insertion piece of the shield cover is inserted, the tongue portions being elastically deformed in a double-swing manner toward the inner space of the base member by an insertion force applied when the corresponding insertion piece of the shield cover is inserted into the cut at the free ends of the tongue portion and functioning as an elastic holding portion that retains and fixes the shield cover on the base member by applying an elastic resilient force such that the insertion piece of the shield cover is elastically held between the free ends.

According to the present invention, each base member has a cut formed at least in a section of the peripheral surface that serves as a top surface, the cut forming an elastically deformable tongue portion. The tongue portion is elastically deformed toward the inner space of the base member by an insertion force applied when the corresponding insertion piece of the shield cover is inserted into the cut at the free end, and elastically retains the corresponding insertion piece of the shield cover on the base member by applying an elastic resilient force. After the base members are conveyed to the circuit board and fixed to the circuit board, a portion of each base member is elastically deformed by the insertion force of the corresponding insertion piece due to the cut in the top surface of the base member, thereby functioning as an elastic holding portion. Therefore, at the time when each base member is conveyed to the circuit board and placed on the circuit board, no opening is formed in the top surface of the base member and the cut for forming the tongue portion is simply formed in the top surface. Therefore, the base members can be conveyed by the suction conveying method, and it is not necessary to convey the base members by a method other than the suction conveying method. As a result, the manufacturing cost can be prevented from being increased due to the conveying method.

In addition, according to the present invention, each insertion piece on the shield cover is inserted into the cut at the free end of the tongue portion in the corresponding base member. The free end of the tongue portion has an edge defined by the cut. Therefore, when each insertion piece on the shield cover is inserted into the cut at the free end of the tongue portion of the corresponding base member, the edge at the free end of the tongue portion relatively slides along the surface of the insertion piece, thereby scraping off an insulating material, such as an oxide film, that is necessarily formed on the surface of the insertion piece. In the case in which the shield cover is connected to the ground via the base members and contact sections between the insertion pieces and the elastic holding portions (tongue portions) of the base members, electrical connection can be reliably established between the insertion pieces on the shield cover and the tongue portions, which function as the elastic holding portions, of the base members without being blocked by the insulating material, such as oxide films, on the surfaces of the insertion pieces. As a result, the reliability of shielding performance of the shield cover that covers the electric circuit on the circuit board can be increased.

According to the present invention, the manufacturing process of shield structures for various devices can be simplified.

BRIEF DESCRIPTION OF DRAWINGS

FIG. 3b is a schematic development of the base member shown in FIG. 3a.

FIG. 8b is a schematic side view of the base member shown in FIG. 8a.

FIG. 10b is a schematic development of the base member shown in FIG. 10a.

FIG. 10c is a schematic side view of the base member shown in FIG. 10a.

FIG. 13b is a schematic exploded view of the shield structure shown in FIG. 13a.

FIG. 13c is a model diagram illustrating a shield-cover attachment base included in the shield structure shown in FIG. 13a.

Figure 1A:
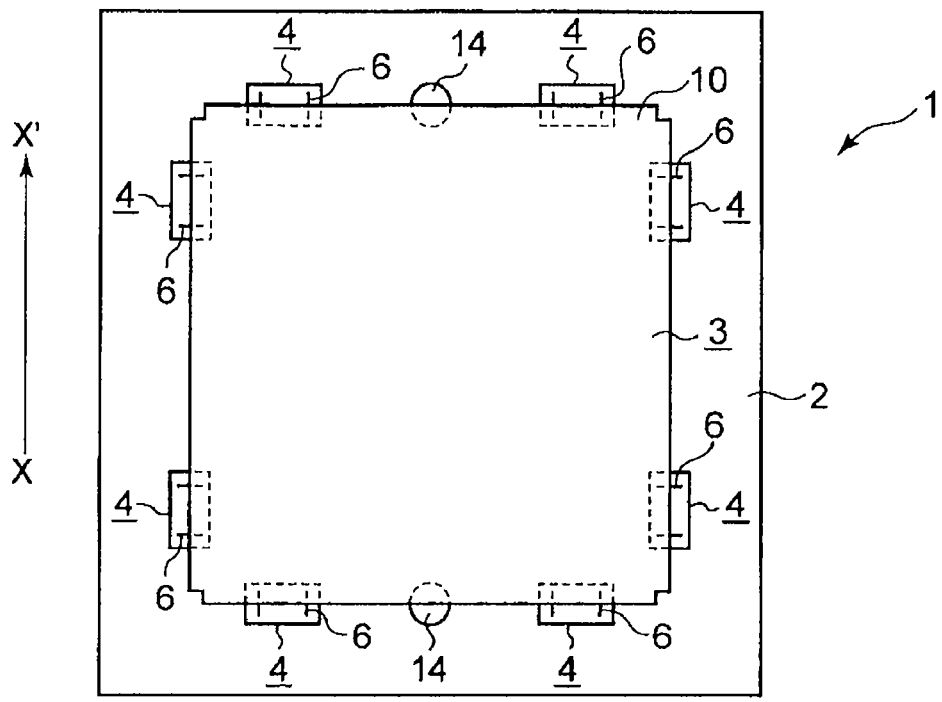
FIG. 1a is a schematic plan view of a shield structure according to a first embodiment viewed from the top.

REFERENCE NUMERALS 1 shield structure
2 circuit board
3 shield cover
4 base member
6 cut
8 tongue portion
11 peripheral wall
12 insertion piece
20 nozzle suction portion

DETAILED DESCRIPTION OF THE INVENTION

Embodiments of the present invention will be described below with reference to the drawings.

Figure 1B:
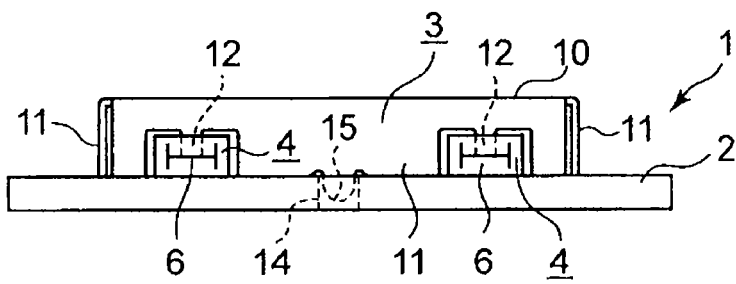
FIG. 1b is a schematic side view of the shield structure according to the first embodiment.
Figure 2:
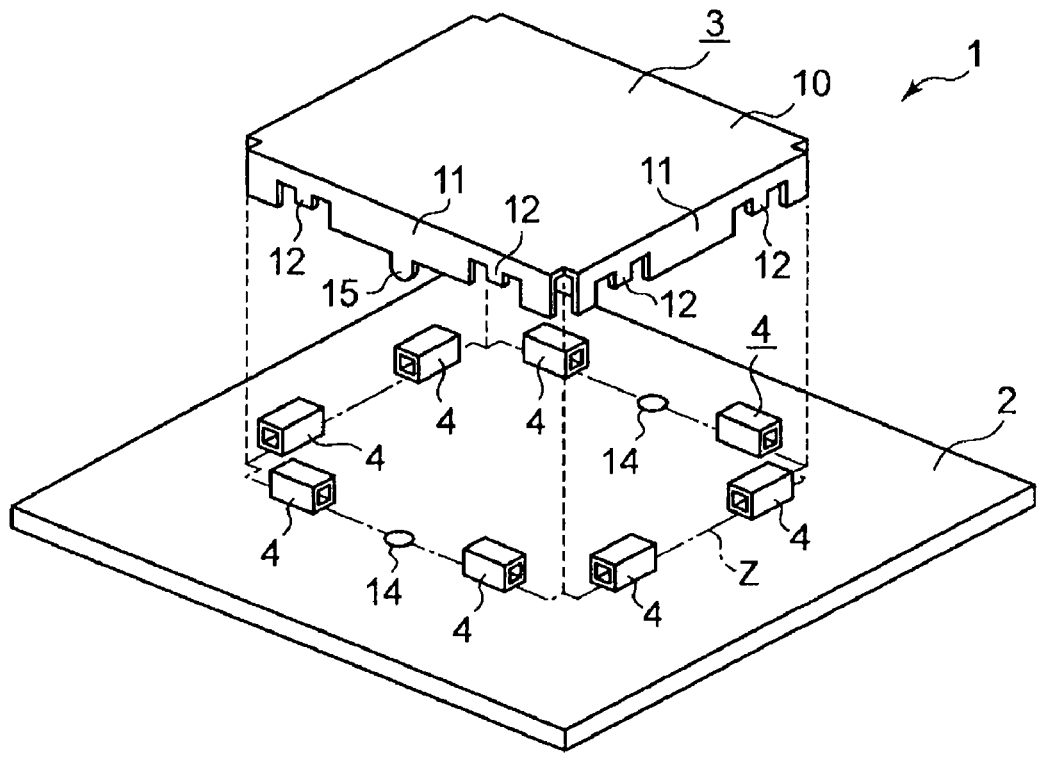
FIG. 2 is a schematic perspective view of the shield structure according to the first embodiment.

FIG. 1a shows a plan view of a shield structure according to a first embodiment viewed from the top. FIG. 1b is a side view of the shield structure shown in FIG. 1a viewed in the direction shown by the arrow (direction from X to X') in FIG. 1a. FIG. 2 is a schematic exploded perspective view of the shield structure shown in FIG. 1a. A shield structure 1 according to the first embodiment includes a shield cover 3 that covers a section to be shielded Z on a board surface of a circuit board 2 so as to shield an electronic circuit formed in the section to be shielded Z on the circuit board 2. The shield structure 1 has a plurality of base members 4 arranged with intervals therebetween along the periphery of the section to be shielded Z on the board surface of the circuit board 2.

Figure 3A:
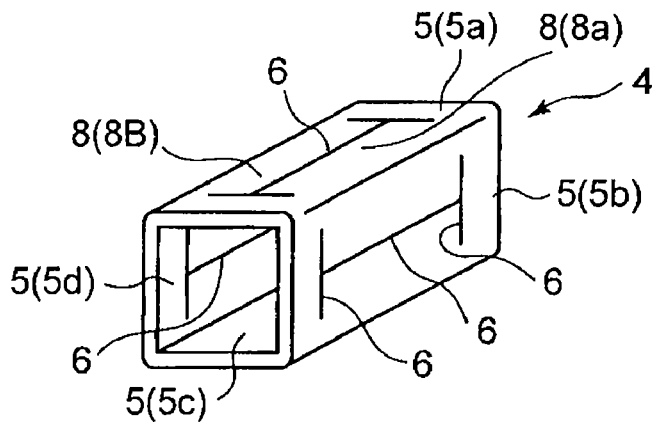
FIG. 3a is a perspective view of a base member included in the shield structure according to the first embodiment.
Figure 3B:
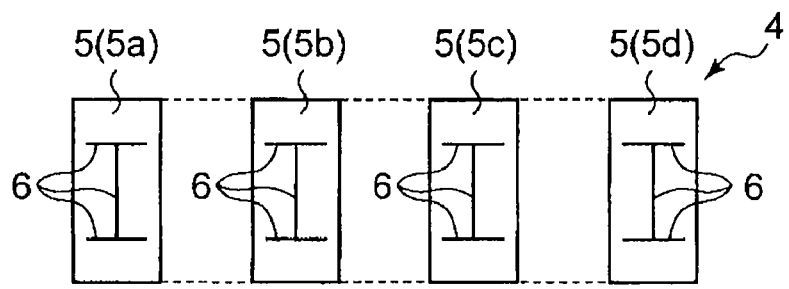

Each of the base members 4 is made of a conductive material. As shown in FIG. 3a, each base member 4 has a rectangular tube shape with a tube hole that is square in cross section. As shown in FIG. 3b, which is a schematic development of each base member 4, four side walls (side surfaces) 5 (5a to 5d) forming the tube wall (peripheral surface) of each base member 4 have identical cuts 6 at positions corresponding to each other. The cuts 6 form a pair of tongue portions 8 (8A and 8B) as shown the model diagram of FIG. 1c. The tongue portions 8A and 8B are formed such that free ends thereof face each other and are elastically deformable.

Figure 4A:
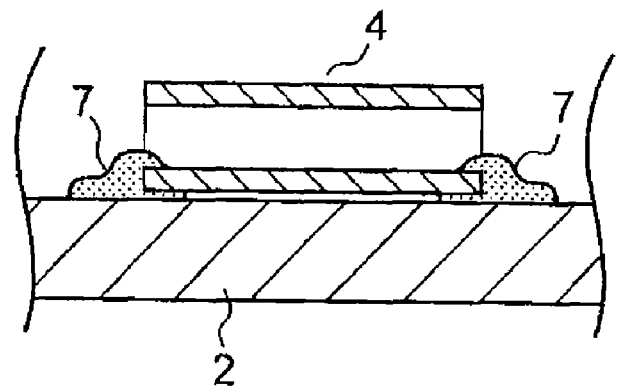
FIG. 4a is a diagram illustrating the manner in which the base member shown in FIG. 3a is bonded to a circuit board.

Each base member 4 having the above-described structure is conveyed to the board surface of the circuit board 2 such that the surface of one of the four side walls 5a to 5d forming the peripheral surface of the base member 4 is retained by, for example, a base-member-conveying suction nozzle (not shown) by suction. Each base member 4 is in a horizontal orientation such that the peripheral surface (side wall 5) extends along the board surface of the circuit board 2. In this state, as shown in FIG. 4a, which is a schematic sectional view, each base member 4 is bonded to the board surface of the circuit board 2 with conductive bonding material 7, such as solder, at a predetermined position. In the first embodiment, a conductive land pattern (not shown) is formed on the circuit board 2 at a position where the base members are arranged. The conductive land pattern is electrically connected to the ground on the circuit board 2, and the conductive land pattern functions as a grounding conductive land pattern. Each of the base members 4 is bonded by the conductive bonding material 7 to the circuit board 2 at a predetermined arrangement position (on the grounding conductive land pattern in the first embodiment). Thus, the base members 4 are connected to the ground on the circuit board 2 via the conductive bonding material 7 and the grounding conductive land pattern.

The base members 4 can be manufactured by cutting a conductive square pipe into pieces having a predetermined length. The base members 4 can also be manufactured by bending a conductive plate into a tubular shape and bonding the edges of the conductive plate that are in contact with each other.

Figure 1C:
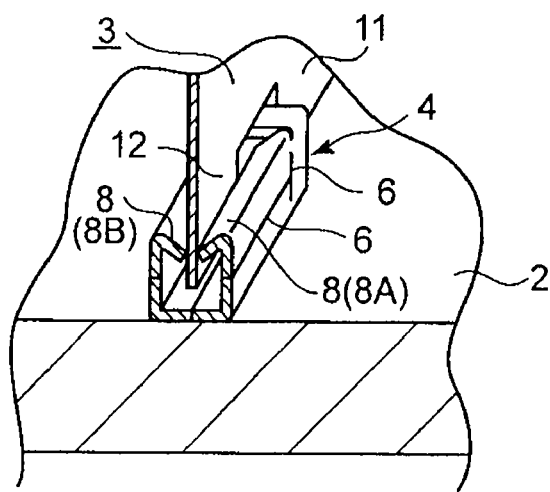
FIG. 1c is a model diagram illustrating a characteristic part of the shield structure according to the first embodiment.
Figure 5A:
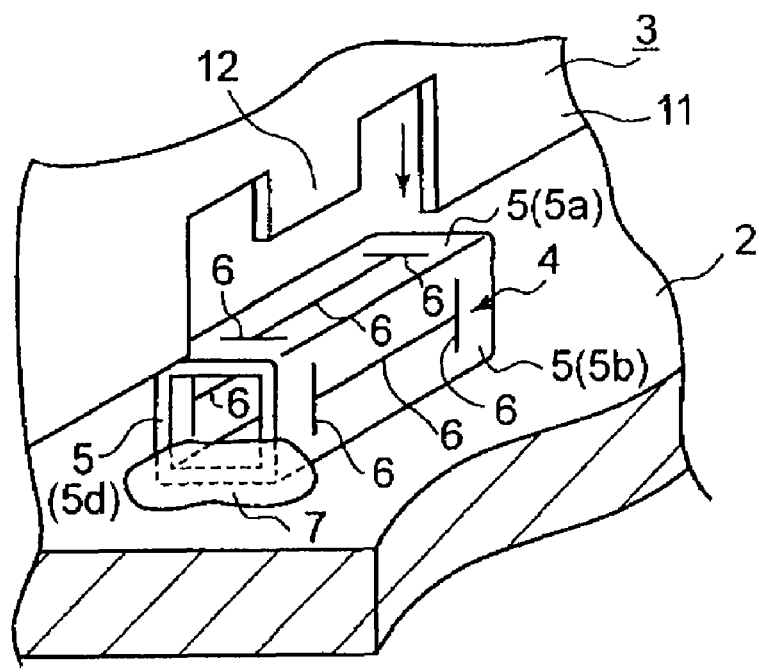
FIG. 5a is a model diagram showing a perspective view illustrating the state before an insertion piece of a shield cover is fixed to the base member.
Figure 5B:
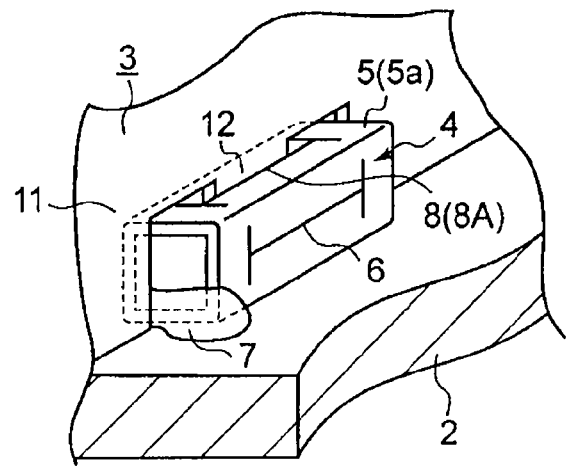
FIG. 5b is a model diagram showing a perspective view illustrating the state in which the insertion piece of the shield cover is fixed to the base member.

The shield cover 3 is constituted of a conductive plate and includes a cover plate 10 that covers the section to be shielded Z on the circuit board 2 and peripheral walls 11 that extend from the periphery of the cover plate 10 toward the periphery of the section to be shielded Z. The peripheral walls 11 of the shield cover 3 have insertion pieces 12 disposed along the edge thereof at positions corresponding to the positions where the base members 4 are arranged. Each of the base members 4 is fixed to the circuit board 2, as shown in FIG. 5a. Each of the insertion pieces 12 is inserted into the corresponding cut 6 in the surface 5a at the top in the peripheral surface of the corresponding base member 4, as shown in FIG. 5b. In the first embodiment, an insertion force is applied when the insertion pieces 12 on the shield cover 3 are inserted into the cuts 6 in the top surfaces 5a of the respective base members 4, and the thus-applied insertion force elastically deforms the pairs of tongue portions 8A and 8B having free ends defined by the cuts 6 formed at the positions where the insertion pieces 12 are inserted. The tongue portions 8A and 8B are elastically deformed in a double-swing manner toward the inner spaces of the respective base members 4. The pairs of tongue portions 8A and 8B serve as elastic retaining members that hold the respective insertion pieces 12 on the shield cover 3 by an elastic resilient force, as shown in FIG. 1c. Thus, each of the insertion pieces 12 on the shield cover is elastically held by the pair of tongue portions 8A and 8B of the corresponding base member 4, so that the shield cover 3 can be attached to the circuit board 2 with the base members 4 disposed therebetween. In addition, the shield cover 3 is connected to the ground of the circuit board 2 via the base members 4 and the elastic-pressure-contact sections between the insertion pieces 12 on the shield cover 3 and the tongue portions 8A and 8B of the respective base members 4. In this manner, the shield cover 3 shields the section to be shielded Z on the circuit board 2.

Figure 6A:
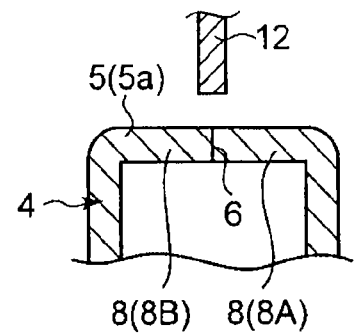
FIG. 6a is a schematic sectional view illustrating the state before tongue portions at the top surface of the base member are elastically deformed.
Figure 6B:
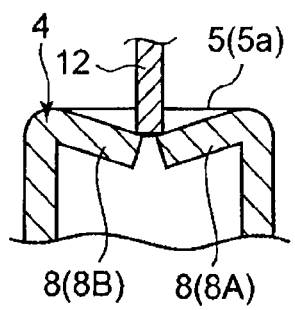
FIG. 6b is a schematic sectional view illustrating the state in which the tongue portions at the top surface of the base member are being elastically deformed.
Figure 6C:
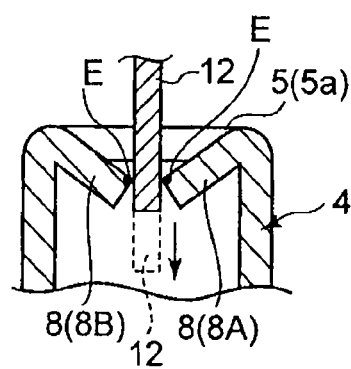
FIG. 6c is a schematic sectional view illustrating the state in which the tongue portions at the top surface of the base member are being elastically deformed continuously after the state shown in FIG. 6b.

In the first embodiment, each insertion piece 12 on the shield cover 3 is inserted between the free ends of the tongue portions 8A and 8B of the corresponding base member 4 such that the insertion piece 12 pushes the free ends of the tongue portions 8A and 8B and the tongue portions 8A and 8B swing away from each other, as shown in FIG. 6*a*, FIG. 6*b*, and FIG. 6*c*, in that order. Referring to FIG. 6*c*, while the insertion piece 12 is being inserted into the base member 4, edges E at the free ends of the tongue portions 8A and 8B relatively slide along the surfaces of the insertion piece 12. In the first embodiment, the insertion pieces 12 are composed of a conductor and an insulating material, such as oxide films, formed on the surfaces of the insertion pieces 12. The insulating material on the surfaces of the insertion pieces 12 can be scraped off when the edges E at the free ends of the tongue portions 8A and 8B slide relative to the insertion pieces 12. In other words, the insulating material is removed from the elastic-pressure-contact sections of the insertion pieces 12 by the tongue portions 8A and 8B of the respective base members 4. As a result, electrical connection can be reliably established between the insertion pieces 12 and the tongue portions 8A and 8B of the respective base members 4 without being adversely affected by the insulating material on the surfaces of the insertion pieces 12. As a result, the shield cover 3 can be reliably connected to the ground of the circuit board 2 via the base members 4, and the reliability of the shielding performance of the shield cover 3 that shields the circuit board 2 can be improved.

Figure 4B:
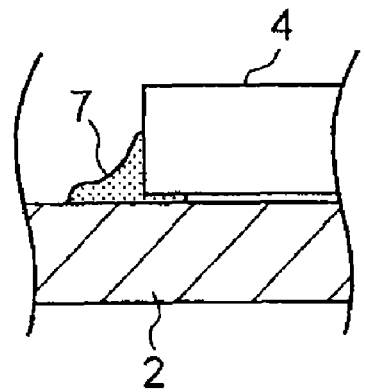
FIG. 4b is a model diagram illustrating a bonding section in which a base member having closed ends is bonded to the circuit board.

In addition, in the first embodiment, each base member 4 has a tubular shape and is open at both ends thereof. Therefore, the conductive bonding material 7 for fixing each base member 4 to the circuit board 2 can flow into the inner space of the base member 4 through the openings at the ends of the base member 4, as shown in FIG. 4*a*. As a result, in the structure of the first embodiment, the bonding strength at which each base member 4 is bonded to the circuit board 2 with the conductive bonding material 7 is higher than that in the case in which a base member 4 having closed end faces as shown in FIG. 4*b* is bonded to the circuit board 2 using the conductive bonding material 7 applied to the end faces of the base member 4. In the case in which the base member 4 having closed end faces as shown in FIG. 4*b* is bonded to the circuit board 2 by applying the conductive bonding material 7 to the end faces of the base member 4, if the conductive bonding material 7 is solder, there is a risk that the solder will excessively flow upward and the solder flux (insulating material) will reach the positions where the tongue portions 8A and 8B are formed. In such a case, the electrical connection between the tongue portions 8A and 8B and the corresponding insertion piece 12 on the shield cover 3 cannot be obtained with high reliability due to the flux. In comparison, according to the first embodiment, the conductive bonding material 7 flows into the inner space of each base member 4 through the openings at both ends thereof. Therefore, the conductive bonding material 7 is prevented from excessively flowing upward. This also contributes to the establishment of reliable electrical connection between the insertion pieces 12 and the tongue portions 8A and 8B on the respective base members 4.

In addition, in the first embodiment, each base member 4 has a tube hole that is square in cross section, and four side walls (side surfaces) 5*a* to 5*d* of each base member 4 have identical cuts 6 at positions corresponding to each other. Due to this structure, the insertion pieces 12 on the shield cover 3 can be inserted into the respective base members 4 and the shield cover 3 can be attached to the base members 4 irrespective of which of the side walls 5*a* to 5*d* of each base member 4 faces upward. In other words, when the base members 4 are conveyed to the circuit board 2 to arrange the base members 4 on the circuit board 2, the base members 4 can be conveyed to the circuit board 2 and fixed to the circuit board 2 without adjusting the orientation of the side surfaces of the base members 4 in the vertical direction. Thus, the cumbersome process of adjusting the orientations of the base members 4 in the vertical direction before conveying the base members 4 can be eliminated. As a result, the manufacturing process of the shield structure 1 can be simplified and the costs can be reduced.

In addition to the above-described structure, the shield structure 1 according to the first embodiment includes the following structure. That is, shield-cover positioning holes 14 are formed along the periphery of the section to be shielded Z on the circuit board 2. In addition, positioning projections 15 that can be fitted to the respective shield-cover positioning holes 14 are formed on edges of the peripheral walls 11 of the shield cover 3. The shield cover 3 can be attached to the circuit board 2 at an accurate position by fitting the positioning projections 15 on the shield cover 3 to the shield-cover positioning holes 14 in the circuit board 2.

Figure 7A:
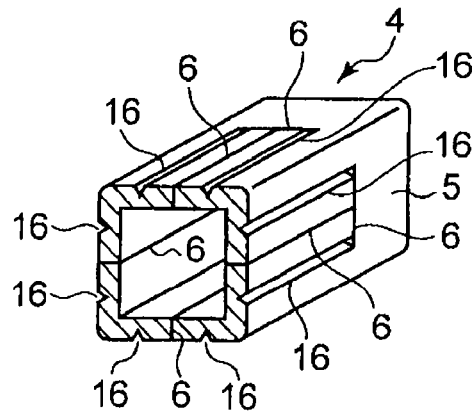
FIG. 7a is a model diagram illustrating another example of a base member.
Figure 7B:
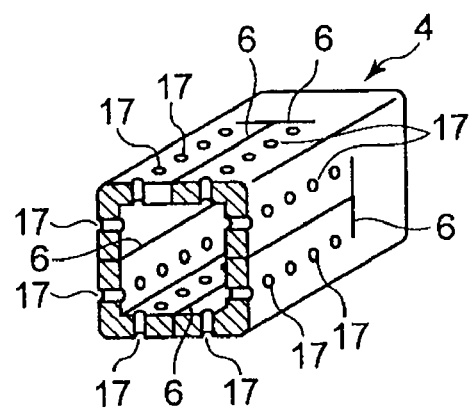
FIG. 7b is a model diagram illustrating another example of a base member.

The shield structure 1 according to the first embodiment is structured as described above. In addition to the structure of the first embodiment, the following structure may also be included. That is, if the tube walls (side walls) 5 of the base members 4 have high rigidity, there may be a risk that the tongue portions 8A and 8B cannot be easily elastically deformed when the insertion pieces 12 on the shield cover 3 are inserted into the respective base members 4. In such a case, the assembling efficiency will be reduced. To prevent this, grooves 16 shown in FIG. 7*a* or holes 17 shown in FIG. 7*b* can be formed in elastic deformation areas of the side walls 5 of the base members 4 so as to facilitate the elastic deformation of the tongue portions 8A and 8B of the base members 4.

Figure 8A:
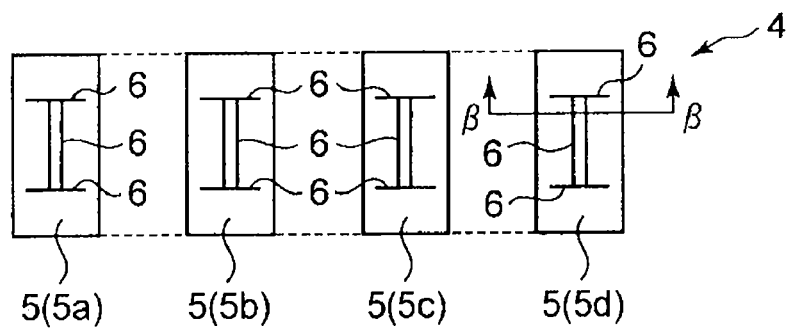
FIG. 8a is a development of another example of a base member.
Figure 8B:
Figure 8C:
FIG. 8c is a schematic sectional view of the base member shown in FIG. 8a taken along line β-β.

In the first embodiment, the base members 4 are conveyed to the circuit board 2 in the state in which the cuts 6 are simply formed in the side walls 5 of the base members 4. However, the base members 4 may also be conveyed to the circuit board 2 after being subjected to preliminary processing. For example, before the base members 4 are conveyed, the tongue portions 8A and 8B formed by the cuts 6 can be bent along the base ends thereof as shown in FIG. 8*a*, which is a schematic development, FIG. 8*b*, which is a side view of each base member 4 viewed from an end face thereof, and FIG. 8*c*, which is a sectional view of the base member 4 shown in FIG. 8*a* taken along line β-β.

A second embodiment will be described below. In the second embodiment, components similar to those of the first embodiment will be denoted by the same reference numerals, and explanations thereof are omitted to avoid redundancy.

Figure 9A:
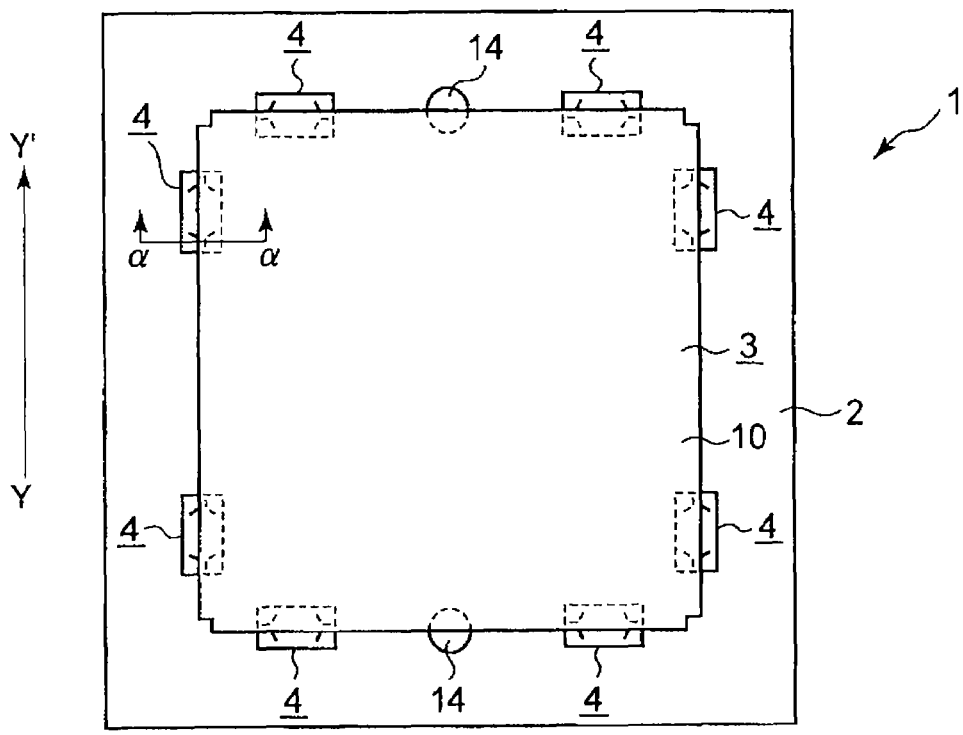
FIG. 9a is a schematic plan view of a shield structure according to a second embodiment viewed from the top.
Figure 9B:
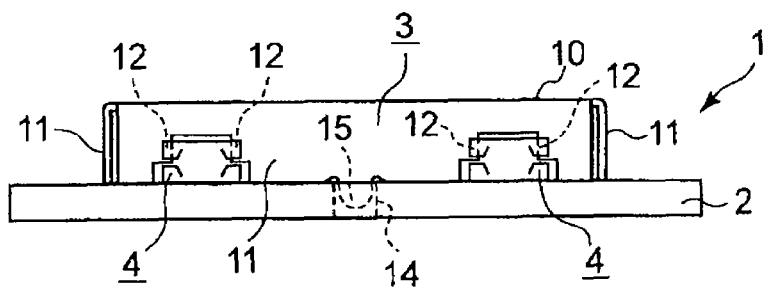
FIG. 9b is a side view of the shield structure according to the second embodiment.
Figure 9C:
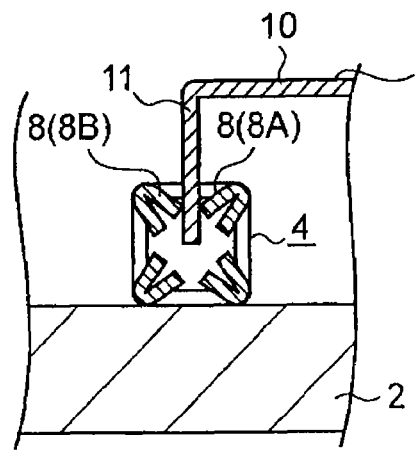
FIG. 9c is a model diagram illustrating a characteristic part of the shield structure according to the second embodiment.
Figure 10A:
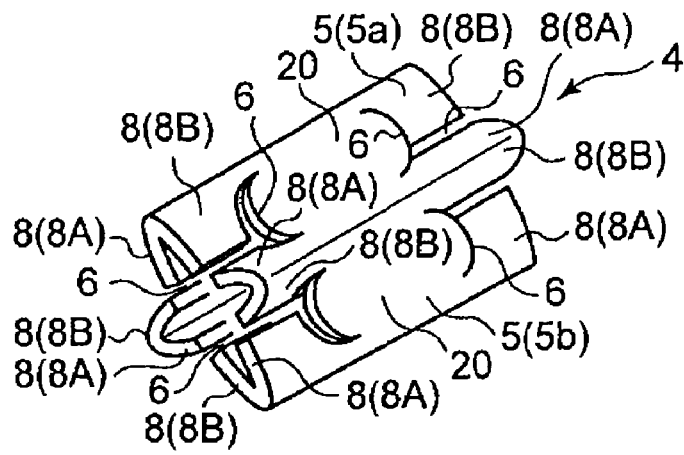
FIG. 10a is a perspective view of a base member included in the shield structure according to the second embodiment.
Figure 10B:
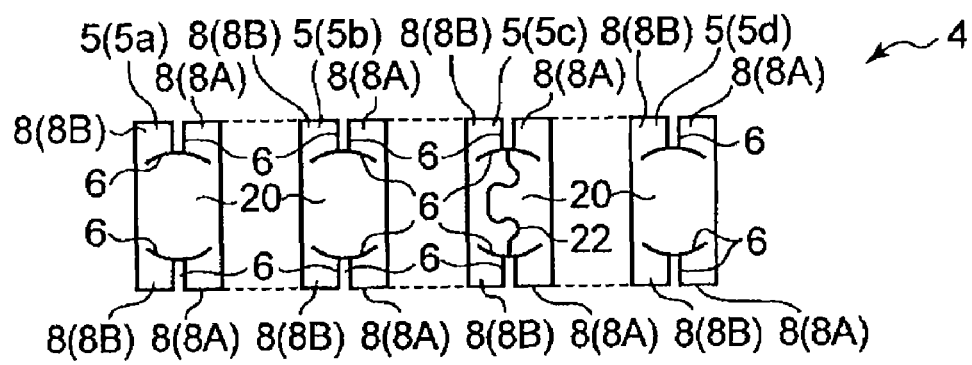
Figure 10C:
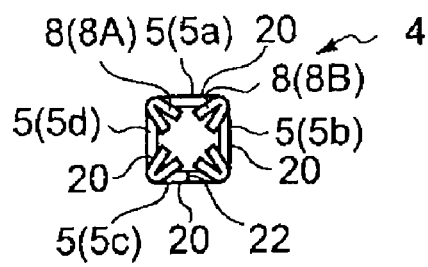

FIG. 9*a* shows a schematic plan view of a shield structure 1 according to the second embodiment viewed from the top. FIG. 9*b* is a schematic side view of the shield structure 1 shown in FIG. 9*a* viewed in the direction shown by the arrow (direction from Y to Y') in FIG. 9*a*. FIG. 9*c* is a schematic sectional view of FIG. 9*a* taken along line α-α. In addition, FIG. 10*a* is a schematic perspective view of each base member 4 included in the shield structure according to the second embodiment. FIG. 10*b* is a schematic development of the base member 4 shown in FIG. 10*a*. FIG. 10*c* is a side view of the base member 4 shown in FIG. 10*a* viewed from an end face thereof.

In the second embodiment, each of the base members 4 has a shape like a rectangular tube with a tube hole that is square in cross section. Four side walls (side surfaces) 5a to 5d forming the peripheral surface (tube wall) of each base member 4 have identical cuts 6 at positions corresponding to each other. The cuts 6 are formed so as to form two elastic holding portions, each of which is constituted of a pair of tongue portions 8A and 8B, and a nozzle suction portion 20 in each of the side walls (side surfaces) 5a to 5d. More specifically, a pair of tongue portions 8A and 8B are formed by the cuts 6 at each end of each of the side walls 5a to 5d of each base member 4, and a region other than the tongue portions 8A and 8B functions as the nozzle suction portion 20 on each of the side walls 5a to 5d of each base member 4. The nozzle suction portion 20 can be retained by the base-member-conveying suction nozzle by suction. The area of the nozzle suction portion 20 is determined in accordance with the nozzle diameter of the base-member-conveying suction nozzle and the area required for forming the tongue portions 8A and 8B that function as the elastic holding portions.

Figure 10D:
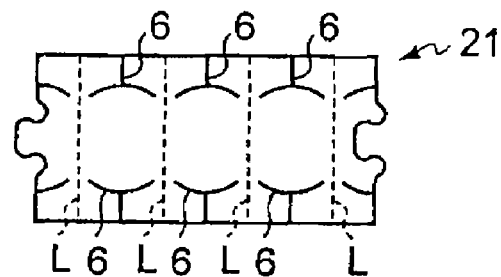
FIG. 10d is a model diagram illustrating an example of a conductive plate using which the base member shown in FIG. 10a is manufactured.

In the second embodiment, each base member 4 is bonded and fixed to the circuit board 2 after being subjected to preliminary processing in which the tongue portions 8A and 8B of each base member 4 are bent at the base ends thereof such that the free ends thereof are directed toward the inner space of the base member 4. The base members 4 can be manufactured by cutting a square pipe into pieces having a predetermined length. Alternatively, each base member 4 can be manufactured by bending a conductive plate 21 shown in FIG. 10d along the dashed lines L into a tubular shape and bonding the edges of the conductive plate 21 together. In the example shown in FIG. 10d, the edges of the conductive plate 21 that are bonded together are shaped such that the edges can be fitted to each other. Thus, the edges can be strongly bonded to each other. In FIGS. 10b and 10c, reference numeral 22 denotes a bonding section formed if the base member 4 is manufactured by bending the conductive plate 21.

Figure 11:
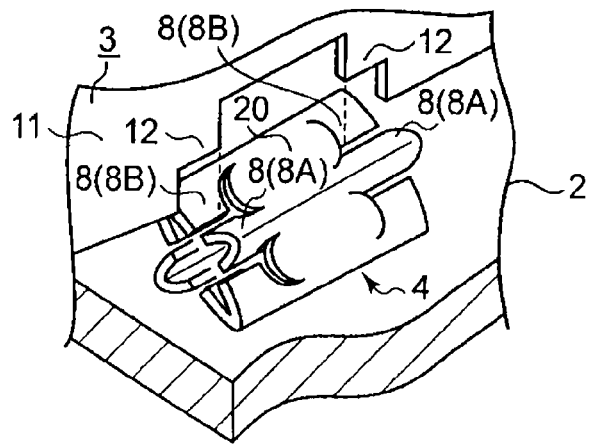
FIG. 11 is a perspective view illustrating the base member shown in FIG. 10a together with an example of insertion pieces provided on a shield cover to be fixed to the base member.

In the second embodiment, insertion pieces 12 shown in FIG. 11 are formed along the edges of a peripheral wall 11 of a shield cover 3 at positions corresponding to the positions where the tongue portions 8A and 8B (elastic holding portions) are formed in the base members 4. The insertion pieces 12 are inserted between the free ends of the tongue portions 8A and 8B that function as elastic holding portions of the base members 4, and are elastically held by the tongue portions 8A and 8B. Thus, the shield cover 3 is attached to the circuit board 2 by being held by and fixed to the base members 4, and is connected to the ground of the circuit board 2 via the base members 4.

Structures other than the above-described structures of the shield structure 1 according to the second embodiment are similar to those of the shield structure 1 according to the first embodiment.

The present invention is not limited to the above-described first and second embodiments, and other various embodiments are possible. For example, although the shield cover 3 is made of a conductive material in each of the first and second embodiments, it is not necessary that the shield cover 3 be made only of a conductive material. For example, the shield cover 3 may also be made of an insulating material with a conductive film formed over the entire surface thereof. In this case, the shielding function is provided by the conductive film.

In addition, although each base member 4 has a rectangular parallelepiped shape in each of the first and second embodiments, the base members 4 may also have a shape other than rectangular parallelepiped, such as a circular column, a polygonal column with five or more vertices in cross section, etc. In addition, although each base member 4 has a tubular shape and is open at both ends thereof in each of the first and second embodiments, one or both of the ends of each base member 4 may also be closed as long as the base members 4 are hollow.

In addition, in the second embodiment, the tongue portions 8A and 8B that function as the elastic holding portions are formed at either end of each base member 4. However, the tongue portions 8A and 8B may also be formed at only one end of each base member 4, and the region other than the tongue portions 8A and 8B may function as the nozzle suction portion 20. In addition, in each of the first and second embodiments, all of the side walls (side surfaces) forming the peripheral surface of each base member 4 have identical cuts 6 forming the tongue portions 8A and 8B at positions corresponding to each other. However, it is not necessary that all of the side surfaces of each base member 4 have the cuts 6 (tongue portions 8A and 8B) as long as the tongue portions 8A and 8B are formed by the cuts 6 at least in the top surface of each base member 4 when the base member 4 is bonded to the circuit board 2.

In the second embodiment, the base members 4 are bonded and fixed to the circuit board 2 after being subjected to preliminary processing in which the tongue portions 8A and 8B are bent along the base edges thereof. However, similar to the first embodiment, also in the second embodiment, the base members 4 may be bonded and fixed to the circuit board 2 in a state such that the cuts 6 for forming the tongue portions are simply formed in the base members 4. In addition, in the base members 4 according to the second embodiment, notches similar to the notches 16 shown in FIG. 7a or holes similar to the holes 17 shown in FIG. 7b may be formed in the base members 4 for facilitating the elastic deformation of the tongue portions 8A and 8B depending on, for example, the rigidity of the tube walls of the base members 4.

In addition, in each of the first and second embodiments, the shield-cover positioning holes 14 are formed in the circuit board 2 and the positioning projections 15 are formed on the shield cover 3 so that the shield cover 3 can be attached to the circuit board 2 with a high positioning accuracy. However, if the shield cover 3 can be placed on the circuit board 2 with a high positioning accuracy by other means, the above-described shield-cover positioning holes 14 and the positioning projections 15 may be omitted. In addition, in each of the first and second embodiments, the base members 4 are connected to the ground of the circuit board 2, and the shield cover 3 is connected to the ground of the circuit board 2 via the base members 4. However, it is not necessary that the base members 4 be connected to the ground of the circuit board 2 if the shield cover 3 is connected to the ground by other grounding means. In such a case, it is not necessary that the base members 4 be made of a conductor.

Figure 12A:
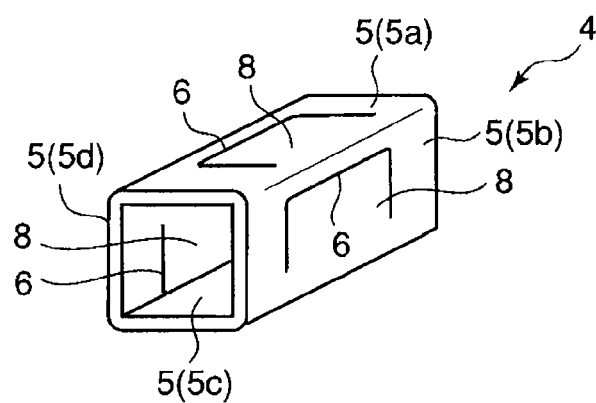
FIG. 12a is a model diagram illustrating another example of a base member.
Figure 12B:
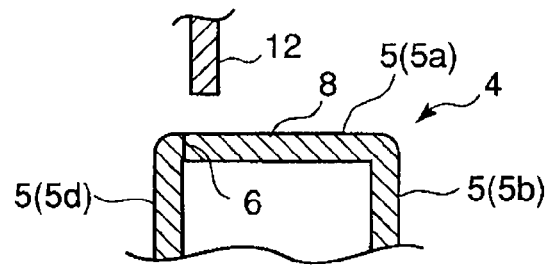
FIG. 12b is a schematic sectional view illustrating the state before a tongue portion at the top surface of the base member shown in FIG. 12a is elastically deformed.
Figure 12C:
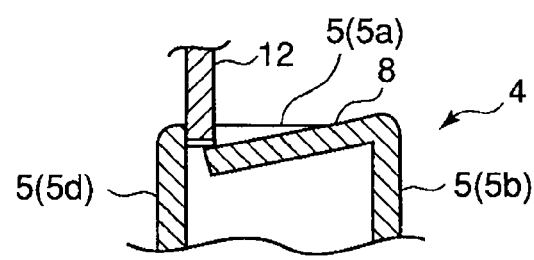
FIG. 12c is a schematic sectional view illustrating the state in which the tongue portion at the top surface of the base member shown in FIG. 12a is being elastically deformed.
Figure 12D:
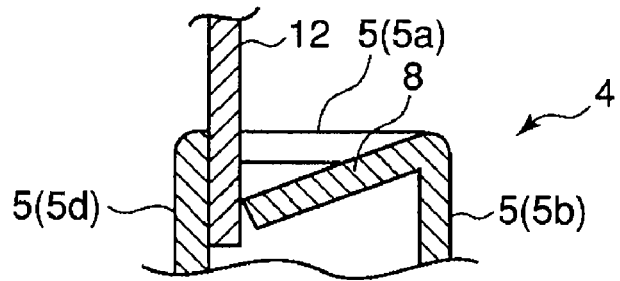
FIG. 12d is a schematic sectional view illustrating the state in which the tongue portion at the top surface of the base member shown in FIG. 12a is being elastically deformed continuously after the state shown in FIG. 12c.
Figure 13A:
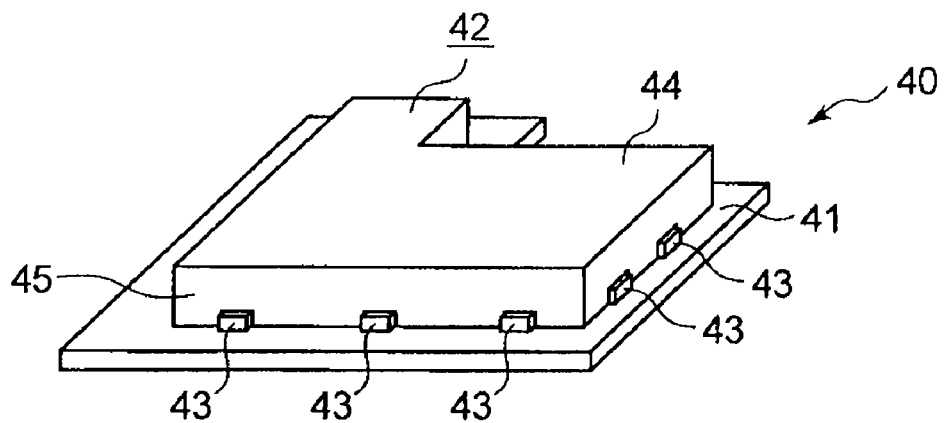
FIG. 13a is a perspective view of a known shield structure.
Figure 13B:
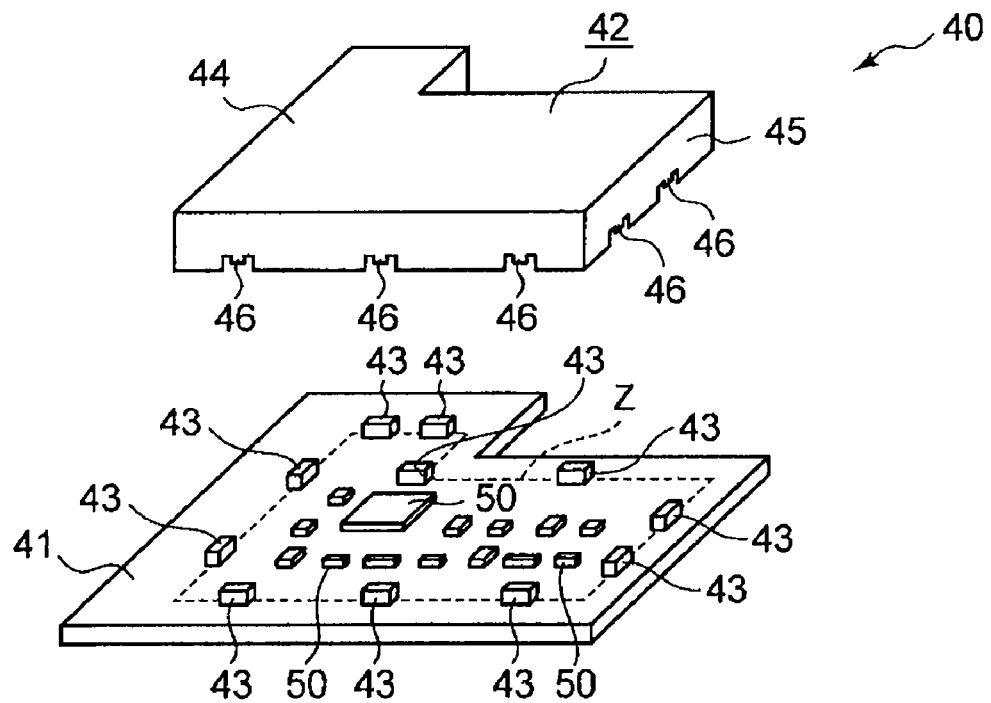
Figure 13C:
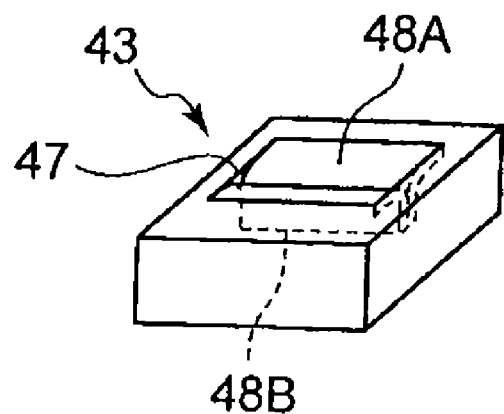
Figure 13D:
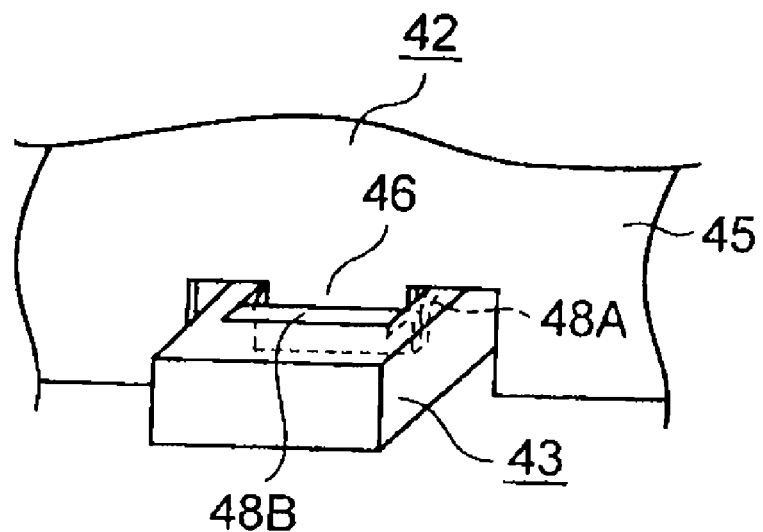
FIG. 13d is a model diagram illustrating the state in which an attachment tab of the shield cover is inserted into and held by the shield-cover attachment base.

In addition, in each of the first and second embodiments, the base members 4 have pairs of tongue portions 8 (8A and 8B), and each pair of tongue portions 8A and 8B can be elastically deformed in a double-swing manner toward the inner space of the corresponding base member 4. However, as shown in FIG. 12a, the base members 4 may also have tongue portions 8 that can be elastically deformed in a single-swing manner. In such a case, each insertion piece 12 is pressed against the corresponding base member 4 by the elastic resilient force applied by the tongue portion 8, and is thereby held between the tongue portion 8 and the base member 4. Also in this case, effects similar to those obtained by the first and second embodiments can be obtained. In the case in which the tongue portions 8 that can be deformed in a single-swing manner are formed as shown in FIG. 12a, the cuts 6 may be formed at positions corresponding to the elongations of the inner wall surfaces of each base member 4. In such a case, each of the insertion pieces 12 on the shield cover 3 can be inserted into the inner space of the corresponding base member 4 along an inner wall surface of the base member 4 while elastically deforming the corresponding tongue portion 8 in the manner shown in FIG. 12b, FIG. 12c, and FIG. 12d, in that order. As a result, each insertion piece 12 is held between the inner wall surface of the corresponding base member 4 and the tongue portion 8.

The invention claimed is:

1. A shield structure for covering a section to be shielded on a surface of a circuit board, the shield structure comprising:
   a plurality of hollow columnar base members arranged with intervals therebetween along a periphery of the section to be shielded on the surface of the circuit board, each of the plurality of base members being in a horizontal orientation such that a peripheral surface of each base member extends along the surface of the circuit board; and
   a shield cover having a cover plate that covers the section to be shielded on the circuit board, and a peripheral wall that extends from a periphery of the cover plate, the peripheral wall having insertion pieces arranged at intervals along an edge of the peripheral wall corresponding to the respective arrangement positions of the plurality of base members,
   each base member having a rectangular prism shape and all four side surfaces of the base member having a respective cut formed at least in a section thereof, each respective cut forming an elastically deformable tongue portion having a free end at a position where a corresponding insertion piece of the shield cover can be inserted, the tongue portion being elastically deformable toward an inner space of the respective base member by an insertion force applied when the corresponding insertion piece of the shield cover is inserted into the cut, the tongue portion retaining and fixing the shield cover on the base members by applying an elastic resilient force such that the free end thereof presses against the corresponding insertion piece of the shield cover.

2. The shield structure according to claim 1, wherein each base member has a nozzle suction portion at least in the section of the peripheral surface facing the shield cover.

3. The shield structure according to claim 1, wherein each of the elastically deformable tongue portions are identical to each other.

4. The shield structure according to claim 1, wherein each base member has a tubular shape that is open at both ends thereof.

5. The shield structure according to claim 1, wherein the insertion pieces are composed of a conductor and an insulating material.

6. The shield structure according to claim 1, further comprising positioning projections arranged at intervals along the edge of the peripheral wall.

7. The shield structure according to claim 1, wherein grooves are provided in the tongue portions of the base members.

8. The shield structure according to claim 1, wherein holes are provided in the tongue portions of the base members.

9. A shield structure for covering a section to be shielded on a surface of a circuit board, the shield structure comprising:
   a plurality of hollow columnar base members arranged with intervals therebetween along a periphery of the section to be shielded on the surface of the circuit board, each of the plurality of base members being in a horizontal orientation such that a peripheral surface of each base member extends along the surface of the circuit board; and
   a shield cover having a cover plate that covers the section to be shielded on the circuit board, and a peripheral wall that extends from a periphery of the cover plate, the peripheral wall having insertion pieces arranged at intervals along an edge of the peripheral wall corresponding to the respective arrangement positions of the base members,
   each base member having a rectangular prism shape and all four side surfaces of the base member having a respective cut formed at least in a section thereof, each respective cut forming a pair of elastically deformable tongue portions having free ends at a position where a corresponding insertion piece of the shield cover can be inserted, the tongue portions being elastically deformable in a double-swing manner toward an inner space of the respective base member by an insertion force applied when the corresponding insertion piece of the shield cover is inserted into the cut, the tongue portions retaining and fixing the shield cover on the base members by applying an elastic resilient force such that the corresponding insertion piece of the shield cover is elastically held between the free ends of the tongue portions.

10. The shield structure according to claim 9, wherein each base member has a nozzle suction portion at least in the section of the peripheral surface facing the shield cover.

11. The shield structure according to claim 9, wherein each of the pair of elastically deformable tongue portions are identical to each other.

12. The shield structure according to claim 9, wherein each base member has a tubular shape that is open at both ends thereof.

13. The shield structure according to claim 9, wherein the insertion pieces are composed of a conductor and an insulating material.

14. The shield structure according to claim 9, further comprising positioning projections arranged at intervals along the edge of the peripheral wall.

15. The shield structure according to claim 9, wherein grooves are provided in the pair of tongue portions of the base members.

16. The shield structure according to claim 9, wherein holes are provided in the pair of tongue portions of the base members.

17. The shield structure according to claim 9, wherein the pair of tongue portions are provided at opposed ends of the base members.

* * * * *